United States Patent [19]

Shiga

[11] Patent Number: 5,649,859
[45] Date of Patent: Jul. 22, 1997

[54] AIR EXHAUSTING CAP STRUCTURE

[75] Inventor: Masaaki Shiga, Shizuoka, Japan

[73] Assignee: Yazaki Corporation, Tokyo, Japan

[21] Appl. No.: 578,956

[22] Filed: Dec. 27, 1995

[30] Foreign Application Priority Data

Jan. 9, 1995 [JP] Japan .................. 7-001561

[51] Int. Cl.⁶ ...................................... F24F 7/00
[52] U.S. Cl. ............... 454/275; 174/16.1; 174/17 VA; 220/374; 220/367.1
[58] Field of Search ................. 454/254, 275, 454/370; 174/16.1, 17 VA; 220/367.1, 374

[56] References Cited

U.S. PATENT DOCUMENTS

| 2,644,610 | 7/1953 | Work ........................ 220/367.1 X |
| 3,454,182 | 7/1969 | Morton ........................ 220/374 |
| 5,549,082 | 8/1996 | Kobayashi ................... 123/143 C |
| 5,558,244 | 9/1996 | Akaike et al. ............. 220/367.1 X |

FOREIGN PATENT DOCUMENTS

| 59-137385 | 9/1984 | Japan . |
| 60-43118 | 3/1985 | Japan . |
| 61-61779 | 4/1986 | Japan . |
| 63-35268 | 3/1988 | Japan . |
| 4-81490 | 7/1992 | Japan . |

*Primary Examiner*—Harold Joyce
*Attorney, Agent, or Firm*—Morgan, Lewis and Bockius, LLP

[57] ABSTRACT

A circumference wall is provided on a slant surface of a case. A cylindrical portion with a through hole for communicating the inside of the case to the outside is protruded inside the circumference wall. A shaft loosely fitted into the through hole is vertically provided from a reversely recessed cap. A falling out preventing portion for preventing the shaft from falling out the through hole is formed at the lower end of the shaft while a gap to the rear surface of the upper plate is secured. A communicating hole communicating with the gap between the shaft and the through hole when the falling out preventing portion is closely brought into contact with the rear surface of the upper plate, is provided on the falling out preventing portion. An outer circumference wall covered on the outside of the circumference wall and disposed to form a gap to the slant surface is vertically provided on the cap.

5 Claims, 3 Drawing Sheets

5,649,859

1

AIR EXHAUSTING CAP STRUCTURE

BACKGROUND OF THE INVENTION

The present invention relates to an air exhausting cap structure in a case such as an electric connection box.

For example, in an electric connection box of an electric car, when a temperature in the box is changed by heat generation of a mounted fuse, relay or the like, the air pressure in the box is changed so that an intake/exhaustion phenomenon occurs through a gap or the like by a pressure difference with respect to the outer air. Thus, in such a container (case), it is positively necessary to provide a communication path for balancing the inner pressure with the outer air. On the other hand, in a car, the waterproof property of a portion communicating with the outer air is an important problem. As an example of a structure in which such ventilation property and water proof property are compatible with each other, one disclosed in Japanese Utility Model Unexamined Publication No. Sho. 63-35268 will be described with reference to FIG. 6.

FIG. 6 is a sectional view showing a conventional air exhausting structure.

A ventilation tube 3 of a distributor cap is covered with a ventilator 5. The ventilator 5 includes a through path 7 opened to the outside in the vertical direction. In the ventilator 5, a containing chamber 9, which is a laterial expansion of the through path 7, is formed. In the containing chamber 9, a ventilation hole 11 of the ventilation tube 3 is opened. The through path 7 orthogonally intersects the ventilation hole 11 at an upper horizontal space 13. The entire of a ventilation path is bent. According to this structure, the through path 7 communicates with the ventilation hole 11 so that the inside of the distributor communicates with the outer air.

In this structure, when water 15 falls to the ventilator 5 so that it enters into the through path 7, the water 15 drops to the lower side as it is as shown by an arrow of a solid line and is drained from a lower end of the through path 7 to the outside. At this time, the outer air is bent at the upper horizontal space 13, and communicates with the inside of the distributor through the ventilation hole 11 as shown by an arrow of a dotted line. That is, the outer air is separted from the water in the portion of the upper horizontal space 13, so that the intrusion of the water 15 into the ventilation hole 11 is prevented. The exhaustion gas in the heated distributor passes through the upper horizontal space 13 in the direction opposite to the arrow of the dotted line and is exhaused to the outside through the through path 7.

However, in the above described conventional air exhausting structure, the upper horizontal space 13 orthogonally intersects the through path 7 opened to the outside, the water 15 dropped into the through path 7 is separated from the outer air by gravity, and only the outer air is led to the upper horizontal space 13. Thus, when minute water drops 15a are attached to an inner wall of the through path 7, there occurs a case in which the attaching force becomes larger than the gravity and the water drops are guided along the inner wall of the upper horizontal space 13 and flown into the ventilation hole 11. Also, there is a problem that when the pressure in the distributor becomes negative, an air stream flowing from the through path 7 into the upper horizontal space 13 is generated and the water 15 intrudes into the upper horizontal space 13 according to this air stream so that separation by the gravity is not sufficiently performed.

SUMMARY OF THE INVENTION

The present invention has been made in view of the above and has an object to provide an air exhausting cap structure by which communication state to the outer air is satisfactorily secured and the intrusion of water is certainly prevented to improve the waterproof property.

An air exhausting cap structure of the present invention to achieve the above object is such an air exhausting cap structure that the inside of the case is communicated with the outside through a through hole and the intrusion of water through the through hole is prevented, and is characterized in that a cylindrical portion having a through hole for communicating the inside of the case with the outside is protruded on an upper plate of the case, a shaft to be loosely fitted into the through hole is vertically provided from the cap, a falling out preventing portion for preventing the shaft from falling out the through hole is formed at the lower end of the shaft with securing a gap to the rear surface of the upper plate, communicating holes communicating with a gap between the shaft and the through hole when the falling out preventing portion is closely brought into contact with the rear surface of the upper plate, are provided in the falling out preventing portion, and an outer circumference wall confronting the upper plate is vertically provided.

When an inner pressure in the case increases, the cap is pushed upward and the falling out preventing portion is brought into contact with the rear surface of the upper plate so that the cap is prevented from falling out. In this state, the outer circumference wall is moved upward, the gap to a slant surface becomes a large opening, the communicating holes of the falling out preventing portion brought into contact with the rear surface communicate with the gap between the shaft and the through hole, and the air in the case is exhaused through the communicating holes, gap between the shaft and the through hole, and the opening to the outside. In this case, the opening becomes wide in accordance with the high pressure in the case, so that the exhaustion becomes smooth.

On the other hand, when an inner pressure in the case decreases, the outer air is sucked, and at the same time, the cap is pressed down. The sucked air enters into the cap through the gap to the slant surface, cut portions, the gap between the shaft and the through hole, and the gap between the rear side of the upper plate and the falling out preventing portion. In that case, the water falling to the cap is removed from the circumference of the cap by the slant surface. The water attached in the gap between the outer circumference wall and the slant surface, is prevented from intruding into the inside by the circumference wall, and the water overriding the circumference wall is fallen into a valley portion between the circumference wall and the cylindrical portion, so that the intrusion of the water into the inside is double prevented. Further, in this case, the cap is pressed down and the gap becomes a slight gap so that easy intrusion of the water into the cap is prevented.

DETAILED DESCRIPTION OF THE INVENTION

Preferred embodiments of the air exhausting cap structure of the present invention will be described below with reference to the drawings.

Figure 1:
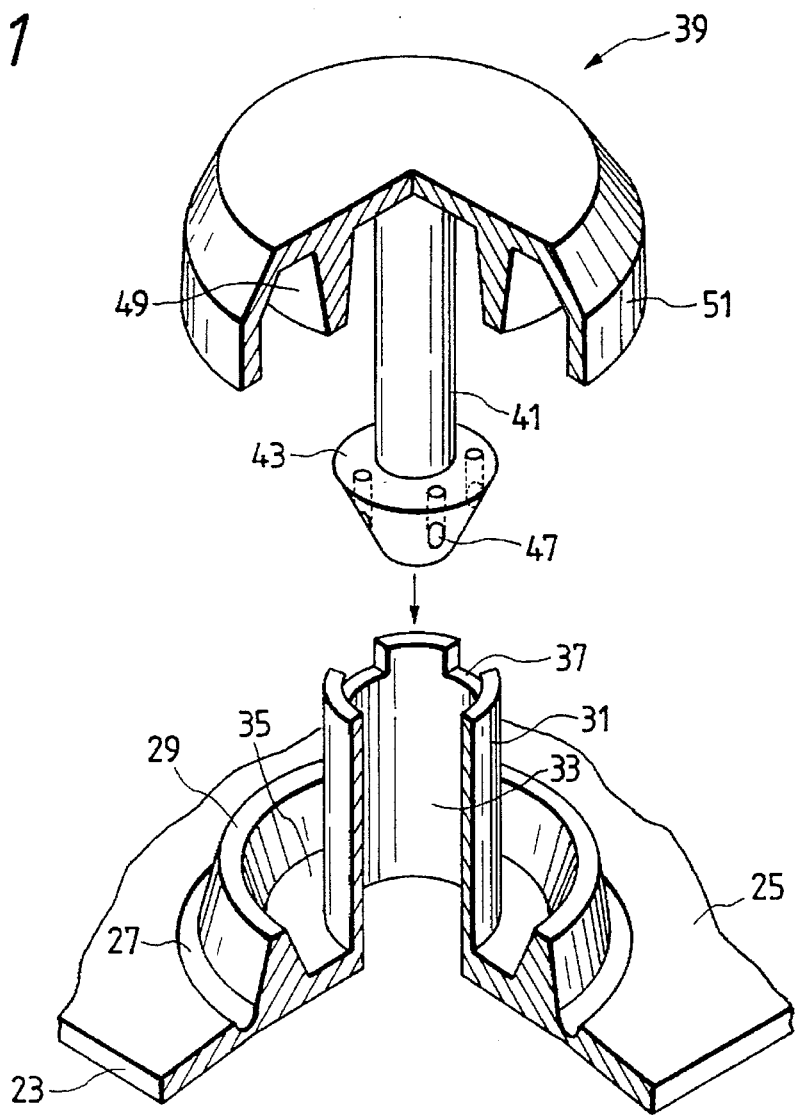
FIG. 1 is a exploded prespective view of an air exhausting cap structure.
Figure 2:
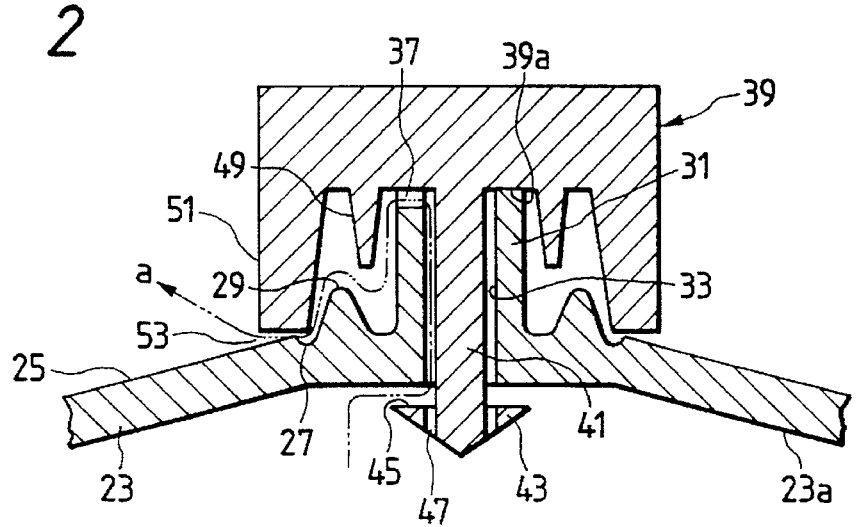
FIG. 2 is a sectional view of the air exhausting cap structure of the present invention.
Figure 3:
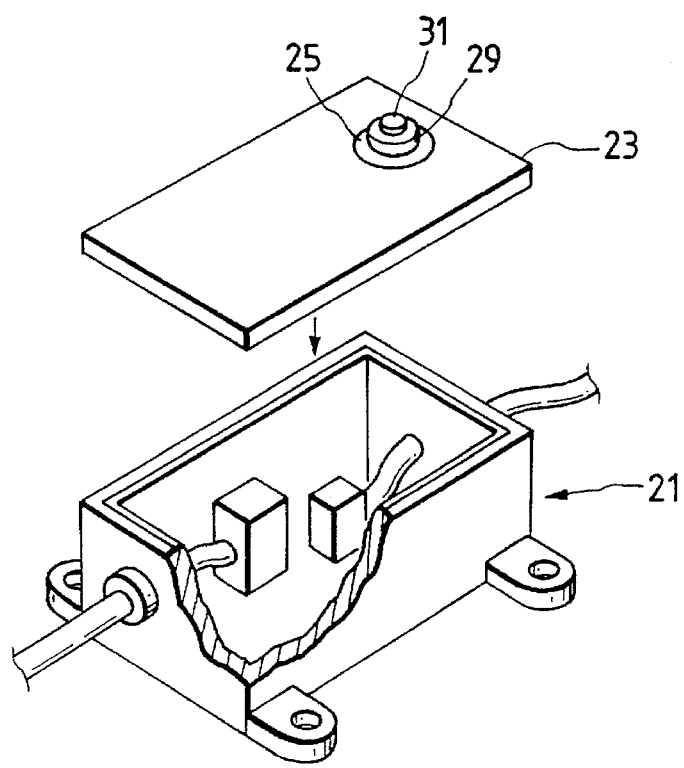
FIG. 3 is a perspective view of an electric connection box including the air exhausting structure of the present invention.

FIG. 1 is an exploded perspective view of an air exhausting cap structure of the present invention. FIG. 2 is a sectional view of the air exhausting cap structure of the present invention, and FIG. 3 is a perspective view of an electric connection box including the air exhausting cap structure of the present invention.

On an upper plate 23 of a case (hereinafter referred to as "electric connection box") 21 (see FIG. 3), a cone shaped slant surface 25 having a high center is formed (see FIGS. 1 and 2). The slant surface includes a concentric circumference groove 27. Inside the circumference groove 27, a circumference wall 29 is concentrically protruded near the circumference groove. Inside the circumference wall 29, a cylindrical portion 31 higher than the circumference wall 29 is concentrically protruded. A through hole 33 inside the cylindrical portion 31 communicates with the inside of the electric connection box 21. Thus, a circular valley portion 35 is formed between the circumference wall 29 and the cylindrical portion 31. Further, some cut portions 37 formed by cutting the edge portion are formed on the upper end of the cylindrical portion 31.

An air exhausting cap (hereinafter referred to as "cap") 39 is attached to the cylindrical portion 31. The cap 39 is formed into a reversely recessed shape in which the upper surface is closed and the lower surface is opened. A shaft 41 is vertically provided on a lower surface 39a of an upper plate of the cap 39. The shaft 41 is loosely fitted into the through hole 33 of the cylindrical portion 31 with a gap therebetween. A reversely cone shaped falling out preventing portion 43 is formed on the lower end of the shaft 41. The falling out preventing portion 43 prevent of the shaft 41 from falling out the through hole 33. The cap 39 is attached to the cylindrical portion 31 such that the shaft 41 loosely fitted into the through hole 33 is prevented from being fallen out by the falling out preventing portion 43. When both or either of the cylindrical portion 31 and the falling out preventing portion 43 is made of a soft material such as rubber, the falling out preventing portion 43 can be easily inserted.

As shown in FIG. 2, when the falling out preventing portion 43 is loosely fitted into the through hole 33, a gap 45 is formed between the falling out preventing portion and a rear surface 23a of the upper plate 23. Thus, even in the state in which the shaft 41 is loosely fitted into the through hole 33, the inside of the electric connection box 21 communicates with the outside through the gap between the shaft 41 and the through hole 33 and the gap 45. A plurality of communicating hole 47 is provided in the vertical direction in the falling out preventing portion 43. The communicating holes 47 communicate with the gap between the shaft 41 and the through hole 33 when the shaft 41 is moved upward by the operation described below and the falling out preventing portion 43 is closely brought into contact with the rear surface 23a of the upper plate 23. That is, even in the state in which the falling out preventing portion 43 is closely brought into contact with the rear surface 23a, the inside of the electric connection box 21 is kept communicating with the outside.

An inner circumference wall 49 is vertically provided on the lower surface 39a of the upper plate of the cap 39 to surround the shaft 41. The inner circumference wall 49 is disposed in the valley portion 35 with a gap therebetween. An outer circumference wall 51 of the cap 39 is vertically provided outside the inner circumference wall 49. The outer circumference wall 51 is covered on the outside of the circumference wall 29. At this time, a slight gap (see FIG. 2) is formed between the lower end of the outer circumference wall 51 and the slant surface 25. However, in the state in which the gap is formed between the falling out preventing portion 43 and the rear surface 23a of the upper plate 23, the lower end of the outer circumference wall 51 may be brought into contact with the slant surface 25 in order to prevent the water or the like from being intruded into the box.

The operation of the thus constructed air exhausting cap structure will be described.

Figure 4:
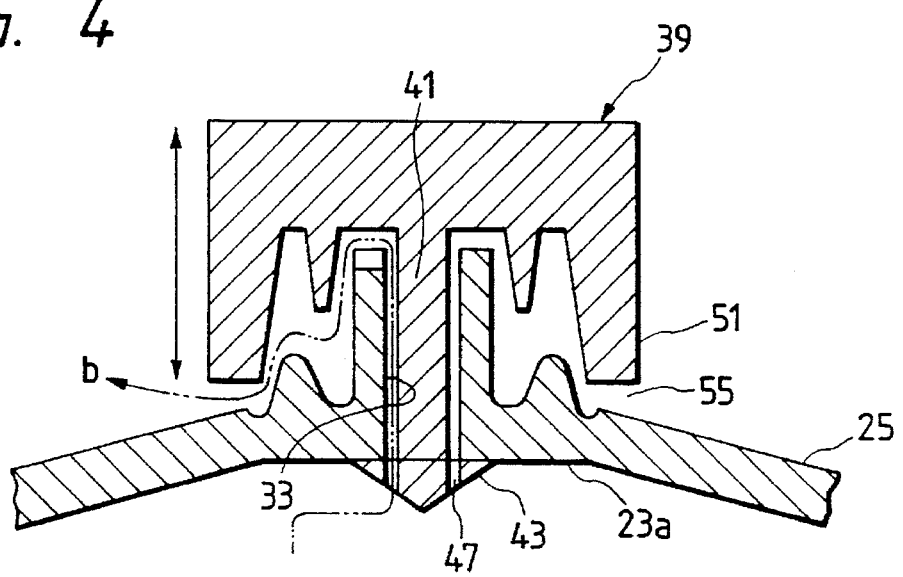
FIG. 4 is a sectional view showing the cap state in which the pressure in the box is positive.
Figure 5:
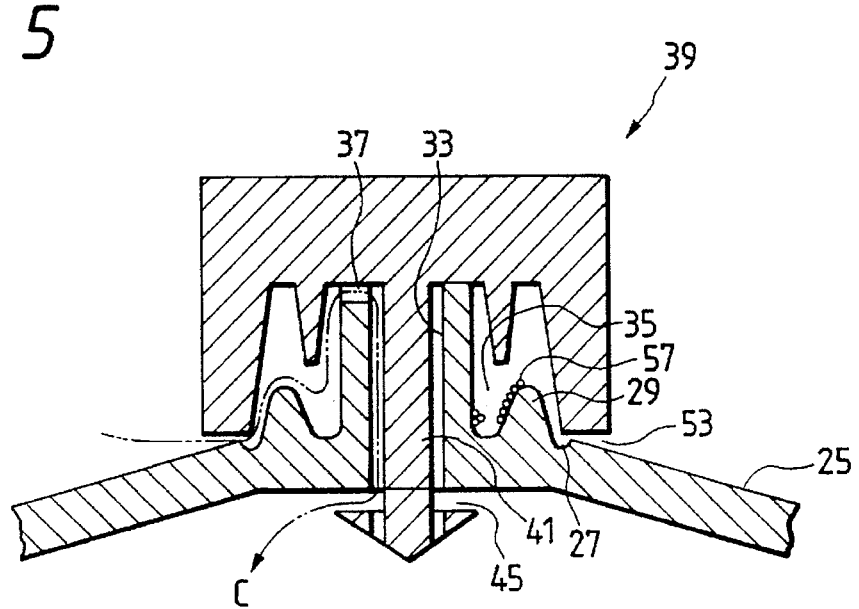
FIG. 5 is a sectional view showing the cap state in which the pressure in the box is negative.
Figure 6:
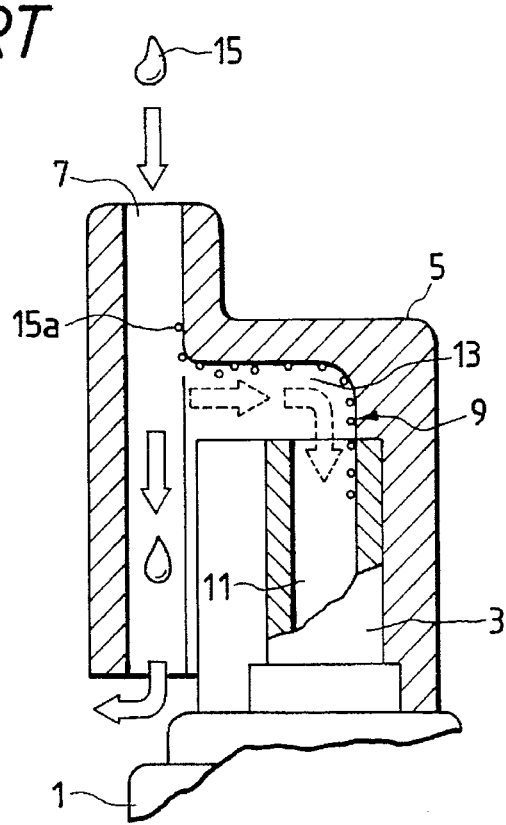
FIG. 6 is a sectional view of a conventional air exhausting structure.

FIG. 4 is a sectional view showing the cap state in which the pressure in the box is positive, and FIG. 5 is a sectional view showing the cap state in which the pressure in the box is negative.

When a temperature in the electric connection box 21 becomes high and the air expands, the inner pressure becomes high, and the air in the box is exhausted to the outside through the path shown by an arrow a shown in FIG. 2, that is, through the gap 45, the gap between the shaft 41 and the through hole 33, the cut portions 37, and the gap 53.

The inner pressure in the electric connection box 21 is further increased, as shown in FIG. 4, the cap 39 is pushed upward, so that the falling out preventing portion 43 is brought into contact with the rear surface 23a to prevent the cap 39 from falling out. In this state, the outer circumference wall 51 is moved upward, so that the gap 53 to the slant surface 25 becomes a large opening 55. In the falling out preventing portion 43 brought into contact with the rear surface 23a, the communicating holes 47 communicate with the gap between the shaft 41 and the through hole 33, and the air in the box is exhausted to the outside through a path shown by an arrow b in FIG. 4, that is, through the communicating holes 47, the gap between the shaft 41 and the through hole 33, and the opening 55. In this case, since the opening 55 becomes wide in accordance with the high pressure in the electric connection box 21, the exhausting resistance becomes low and exhaustion becomes smooth.

On the other hand, when a temperature in the electric conection box 21 is lowered, the air contracts, the inner pressure is decreased, and the outer air is sucked. At the same time, the cap 39 is pressed down into the state shown in FIG. 5. The sucked air is entered into the electric connection box 21 through a path shown by an arrow c in FIG. 5, that is, through the gap 53, the cut portions 37, the gap between the shaft 41 and the through hole 33, and the gap 45.

In that case, the water fallen to the cap 39 is removed from the circumference of the cap 39 by the slant surface 25. The water attached in the gap 53 enters into the circumference groove 27, and is prevented from intruding into the inside by the circumference wall 29. When the water drops 57 are attached to the circimference wall 29, a zigzag path formed of especially the circumference wall 29, the inner circumference wall 49 of cap 39, and the cylindrical portion 31 is preferably operated, so that the water drops 57 are fallen into the valley portion 35 and are prevented from intruding into the inside. According to this, the water from the outside is prevented from overriding by the double recessed portions. Further, in this case, the cap 39 is pressed downward as described above, so that the opening 55 becomes the slight opening 53. Thus, easy flowing of the water into the cap 39 is prevented. According to this feature also, the waterproof porperty is increased.

In the above embodiment, the communicating holes 47 are formed of holes provided in the falling out preventing portion 43. However, the communicating holes 47 may be slit-shaped grooves formed by cutting the falling out preventing portion including the outer surface.

Further, the gap 53 can be secured by shortening the outer circumference wall 51 so that the gap is formed between the lower end of the outer circumference wall 51 and the slant surface 25 when the lower surface 39a (see FIG. 2) of the upper plate of the cap 39 is brought into contact with the front end of the cylindrical portion 31. However, the gap may be secured by providing a plurality of cut portions at the lower end of the outer circumference wall 51.

As described above in detail, according to the air exhausting cap structure of the present invention, a circumference wall and a cylindrical portion are protruded on a slant surface of a case, a shaft loosely fitted into a through hole of the cylindrical portion is vertically provided in the cap with a reversely recessed shape, a falling out preventing portion is formed at the lower end of the shaft, and an outer circumference wall arranged to form a gap to the slant surface is vertically provided on the cap. Accordingly, when a pressure in the case becomes high, the cap is pushed upward and the gap between the outer circumference wall and the slant surface becomes wide, so that the exhaustion can be smoothly performed. On the other hand, when a pressure in the case becomes low, the cap is lowered and the opening becomes a slight gap, so that the intake of the air is performed while easy flowing of the water is prevented. In that case, the water, which possibly intrudes into the case along with the intake air, is double prevented from intruding by the circumference wall and the valley portion between the circumference wall and the cylindrical portion. As a result, it is possible to certainly prevent the intrusion of water while the communicating state to the outside is sufficinetly secured.

What is claimed is:

1. An air exhausting cap structure, comprising:

an upper plate of a case;

a cylindrical portion protruded on said upper plate, said cylindrical portion having a through hole for communicating an inside of the case to an outside;

a cap;

a shaft vertically provided on said cap, said shaft being loosely fitted into said through hole;

a falling out preventing portion formed on an lower end of said shaft to secure a gap between said falling out preventing portion and a rear surface of said upper plate, said falling out preventing portion preventing said shaft from falling out said through hole;

a communicating hole provided in said falling out preventing portion, said communicating hole communicating the inside of the cap with a gap between said shaft and said through hole when said falling out preventing portion is closely brought into contact with said rear surface of said upper plate; and an outer circumference wall vertically provided on said cap and confronting said upper plate.

2. An air exhausting cap structure as claimed in claim 1, wherein said cylindrical portion is provided with a cut portion at an upper end of said cylindrical portion.

3. An air exhausting structure as claimed in claim 1, wherein said upper plate of the case is provided with a slant surface descending from said cylindrical portion to an outside.

4. An air exhausting structure as claimed in claim 3, further comprising a circumference wall formed on said slant portion and surrounding said cylindrical portion, said outer circumference wall of said cap covering an outside of said circumference wall of said slant surface.

5. An air exhausting cap structure as claimed in claim 4, further comprising an inner circumference wall vertically provided on a lower surface of said cap, said inner circumference wall surrounding said shaft and disposed between said cylindrical portion and said circumference wall of said slant surface.

\* \* \* \* \*